United States Patent [19]

Shacter

[11] Patent Number: 4,968,901
[45] Date of Patent: Nov. 6, 1990

[54] INTEGRATED CIRCUIT HIGH FREQUENCY INPUT ATTENUATOR CIRCUIT

[75] Inventor: Stuart B. Shacter, Tucson, Ariz.

[73] Assignee: Burr-Brown Corporation, Tucson, Ariz.

[21] Appl. No.: 352,849

[22] Filed: May 16, 1989

[51] Int. Cl.⁵ .......................... H03K 5/24; H03H 7/24
[52] U.S. Cl. .................... 307/360; 307/491;
307/494; 307/540; 307/555; 333/81 R
[58] Field of Search ............... 307/360, 491, 494, 540,
307/552, 555, 443; 333/81 R

[56] References Cited

U.S. PATENT DOCUMENTS

| | | | |
|---|---|---|---|
| 3,594,632 | 7/1971 | Luger | 333/81 R |
| 4,181,878 | 1/1980 | Murari et al. | 323/94 |
| 4,181,903 | 1/1980 | Holland et al. | 333/81 |
| 4,507,618 | 3/1985 | Nelson | 333/81 R |
| 4,527,180 | 7/1985 | Oto | 357/23.6 |
| 4,543,498 | 9/1985 | Gorecki | 307/360 |
| 4,578,695 | 3/1986 | Delaporte et al. | 357/48 |
| 4,618,875 | 10/1986 | Flohrs | 357/46 |
| 4,684,881 | 8/1987 | Diller et al. | 333/81 R |
| 4,743,779 | 5/1988 | Valley | 307/356 |
| 4,755,694 | 7/1988 | Bodig et al. | 307/315 |
| 4,803,382 | 2/1989 | Tanimoto et al. | 307/362 |
| 4,859,872 | 8/1989 | Hyakutake | 307/555 |

Primary Examiner—John Zazworsky
Attorney, Agent, or Firm—Cahill, Sutton & Thomas

[57] ABSTRACT

An attenuator for use in an integrated circuit window comparator circuit provides voltage division across an input voltage divider including a large number of identical thin film resistor segments combined in various series and parallel arrangements so that resistive voltage division of the input signal is in the same ratio as capacitive voltage division of the input signal by parasitic capacitances of the resistors.

17 Claims, 3 Drawing Sheets

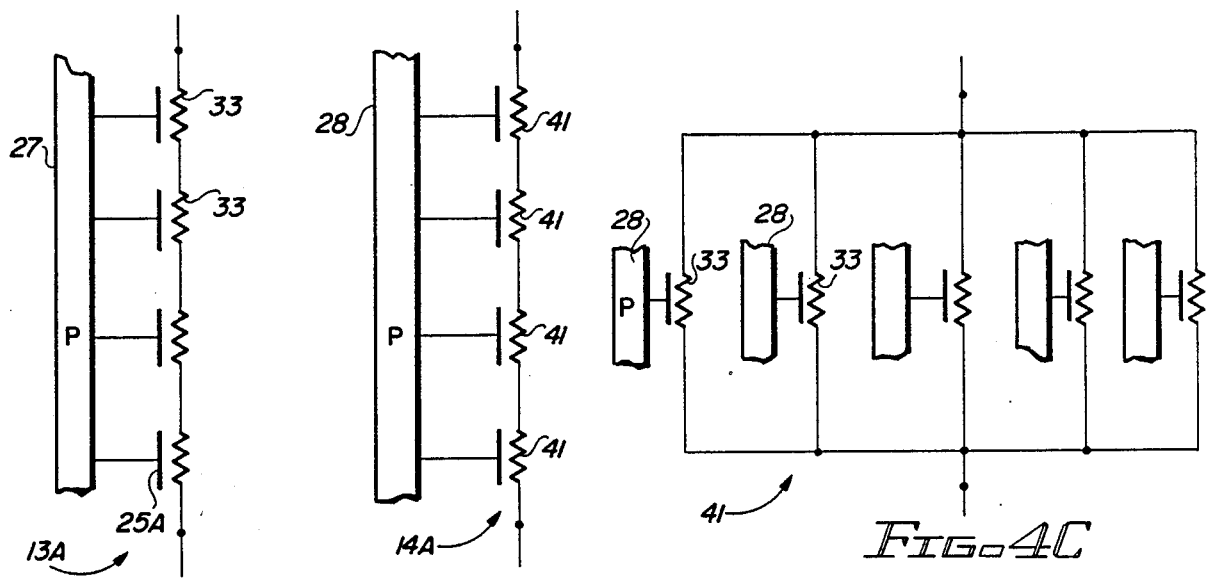
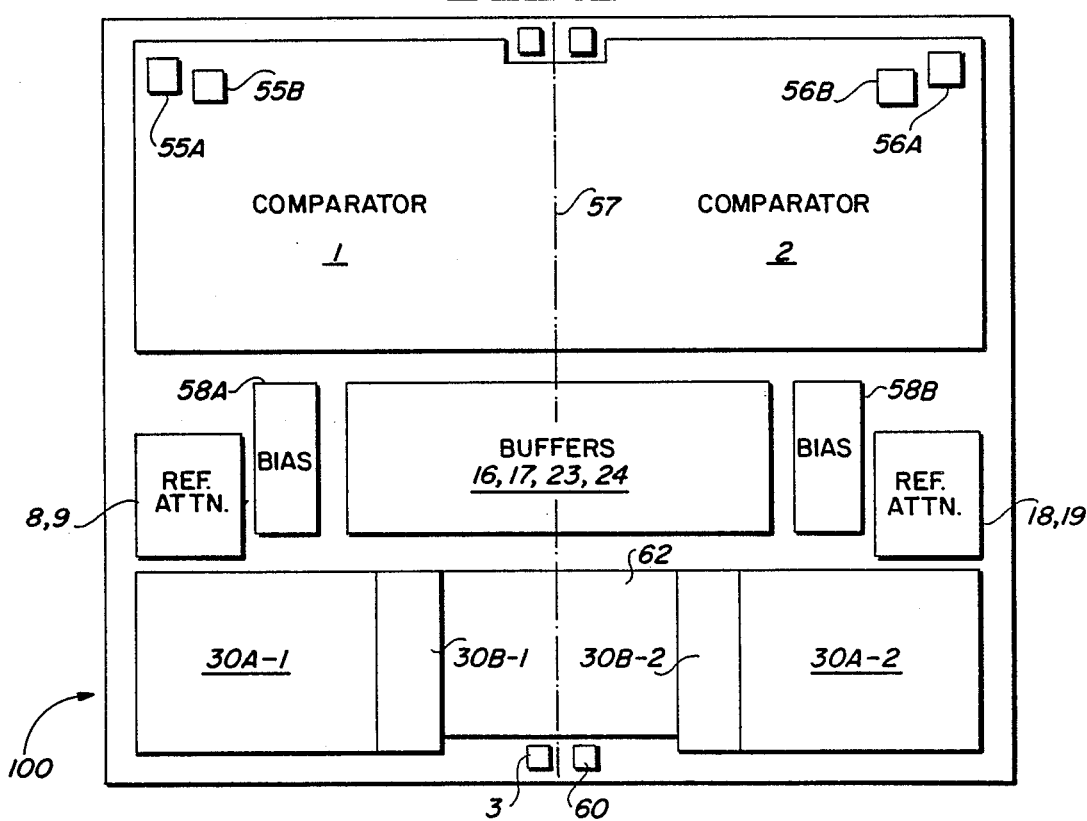

INTEGRATED CIRCUIT HIGH FREQUENCY INPUT ATTENUATOR CIRCUIT

BACKGROUND OF THE INVENTION

The invention relates to a precision high frequency integrated circuit attenuator, which can be used in various integrated circuits, such as a window comparator circuit of the type which indicates whether an input voltage is within or outside of a predefined range or an analog-to-digital converter.

FIG. 1 shows a typical window comparator circuit including a comparator 1 having a non-inverting (+) input connected by conductor 4 to a first reference voltage $V_{REF1}$, its inverting (−) input connected to conductor 3 to an input signal $V_{IN}$, and its output connected by conductor 6 to produce an output signal $V_{01}$. A second comparator has its non-inverting input connected to conductor 3, its inverting input connected by conductor 5 to a second reference voltage $V_{REF2}$, and its output connected by conductor 7 to produce an output voltage $V_{02}$. If $V_{IN}$ is between $V_{REF1}$ and $V_{REF2}$, comparator 1 will not invert, so $V_{01}$ will be high. Comparator 2 will not invert, so $V_{02}$ will be high. If $V_{IN}$ is less than $V_{REF2}$, comparator 2 inverts, so $V_{02}$ will be low. If $V_{IN}$ is greater than $V_{REF1}$, comparator 1 will invert, so $V_{01}$ will be low.

Several difficult problems arise if a high speed window comparator of the general type shown in FIG. 1 is to be integrated onto a single monolithic integrated circuit chip. For typical standard integrated circuit manufacturing processes, the permissible range for the input signal $V_{IN}$ which can be applied directly to electrodes of integrated circuit transistors without causing undesired forward biasing of PN junctions and/or undesired PN junction breakdown is quite limited, typically between ground and −3 to +3 volts for present high speed IC comparators. If resistive voltage dividers are used to attenuate the input signal and reference signal before they are applied to the inputs of the integrated circuit comparators, the frequency response of the circuit is very poor because parasitic capacitors of integrated circuit resistors such as 25 and 26 in FIG. 2 usually are proportional to the resistor values and respond much differently to rapidly rising and rapidly falling edges of $V_{IN}$ than do the resistors 13 and 14. The result of this is unacceptable inaccuracies in the attenuation of $V_{IN}$. For example, if resistors 13 and 14 are ordinary nichrome resistors and if the resistance of resistor 13 is five times that of resistor 14, the parasitic capacitance associated with resistor 13 is likely to be much larger than the parasitic capacitance 26 associated with resistor 14. Therefore, capacitive voltage division of $V_{IN}$ across parasitic capacitances 25 and 26 occurs in the opposite sense to voltage division of $V_{IN}$ across resistors 13 and 14, causing substantial errors in the attenuation of $V_{IN}$ from conductor 3 to conductor 15 for high frequency components. This, of course, causes inaccuracy in the results produced by the window comparator circuit 100.

Thus, there is an unmet need for an improved integrated circuit attenuator that can be used in an integrated circuit wherein accurate attenuation of both low frequency and high frequency input signals is needed, and especially where the amplitude of the input signals exceed the voltage tolerance capabilities of the internal integrated circuit which receives the attenuated signal.

SUMMARY OF THE INVENTION

Accordingly, it is an object of the invention to provide an integrated circuit attenuator circuit which avoids errors due to unequal dividing of low frequency and high frequency components of an input signal.

It is another object of the invention to provide an accurate, integrated circuit attenuator capable of accurately attenuating high frequency input signals, especially input signals having such large amplitudes that would normally cause undesired reverse biasing and/or forward biasing of certain PN junctions in the integrated circuit in which the attenuator included.

It is another object of the invention to provide an accurate, high speed integrated circuit attenuator which operates accurately in response to high frequency signals having a voltage range substantially beyond levels at which certain PN junctions of the integrated circuit undergo undesired reverse junction breakdown and/or undesired forward biasing of certain PN junctions.

It is another object of the invention to provide a window comparator circuit capable of producing accurate results for input signals with high frequency components and having voltages within a range that greatly exceeds certain maximum PN junction breakdown voltages of the integrated circuit and causes undesired forward biasing of certain PN junctions therein.

Briefly described and in accordance with one embodiment thereof, the invention provides an integrated circuit attenuator, which can be used as an input attenuator for an integrated circuit window comparator, analog-to-digital converter, or the like, including a divider circuit for dividing an external input voltage, the divider circuit including a thin film first resistor having a first terminal receiving the input voltage, a thin film second resistor having a first terminal connected to a reference voltage conductor and a second terminal connected to a second terminal of the first resistor to produce an attenuated input signal. A buffer applies the attenuated input signal to an integrated circuit window comparator, analog-to-digital converter or the like on the same chip. The first resistor includes a plurality of separate identical segments connected in series between its first and second terminals, and the second resistor includes a plurality of separate identical segments connected in series-parallel arrangement so that the ratio of the resistance of the first resistor to the resistance of the second resistor is precisely equal to the ratio of the parasitic capacitance of the second resistor to the parasitic capacitance of the first resistor. All of the identical segments of the first resistor are formed over an isolated region of a first integrated circuit structure, and all of the isolated segments of the second resistor are formed over a second isolated region of the integrated circuit structure. In the described embodiment, the first and second isolated regions are P-type regions each formed in an N-type region, and the first isolated region is connected to receive the input signal and the second isolated region is connected to the reference voltage conductor. The second resistor includes a plurality of series-connected groups of the identical segments, each of the groups including a plurality of the identical segments connected in parallel. In one embodiment, the attenuator is connected to an input of window comparator on the same chip wherein first and second voltage dividers are provided which divide first and second reference voltages, respectively, in the same ratio that the divider circuit divides the input voltage. In another embodiment, the attenuator is connected to an analog input of an analog-to-digital converter on the same chip.

BRIEF DESCRIPTION OF THE DRAWINGS

FIG. 4A illustrates the structure in detail 4A in FIG. 4.

FIG. 4B illustrates the structure in detail 4B in FIG. 4.

FIG. 4C is a diagram of one of the resistors in FIG. 4B.

FIG. 5 indicates the topography of an integrated circuit including the attenuator of the present invention and a window comparator circuit.

DETAILED DESCRIPTION OF THE PREFERRED EMBODIMENTS

Figure 1:
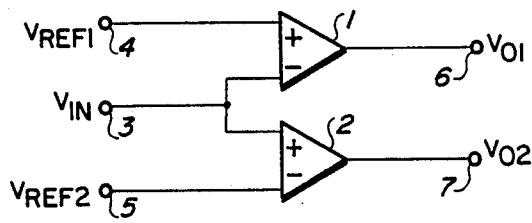
FIG. 1 is a schematic diagram of a prior art window comparator circuit.
Figure 2:
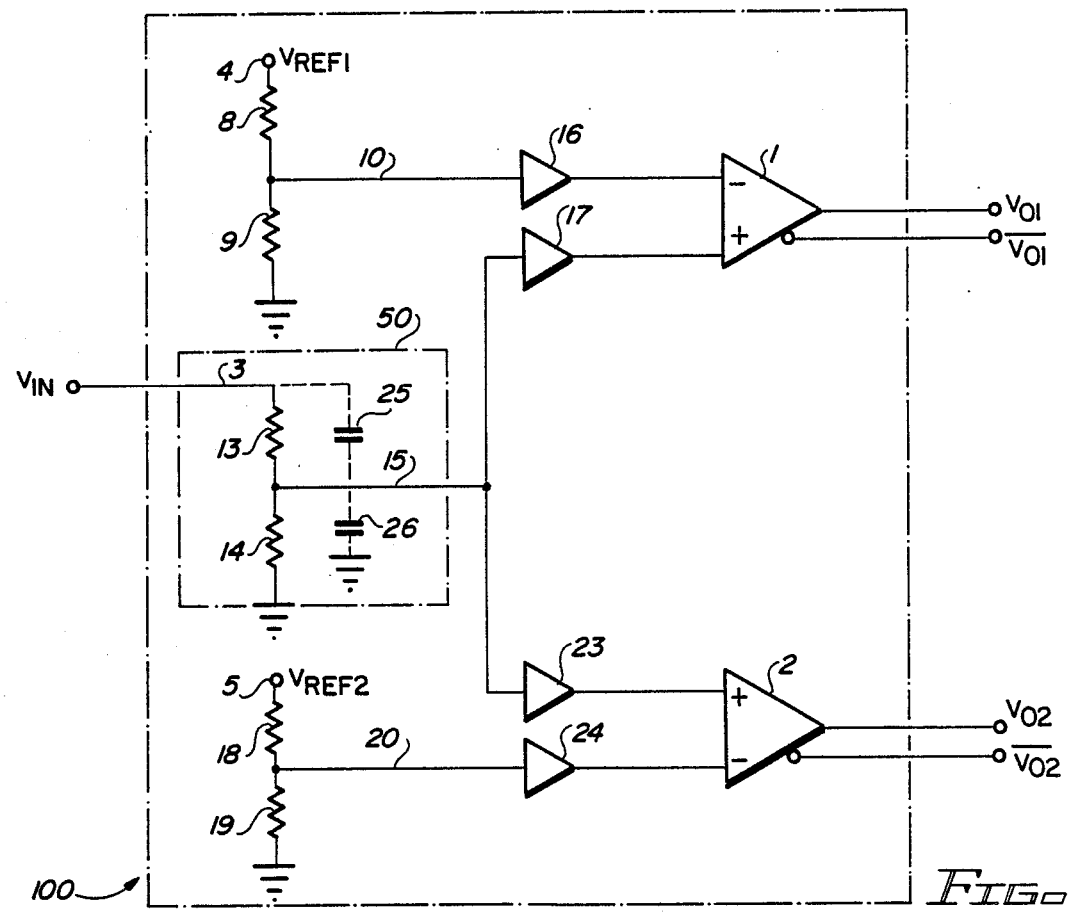
FIG. 2 is a schematic diagram of an integrated circuit window comparator useful in describing the problems of the prior art and also in describing the present invention.

In FIG. 2, numeral 100 designates an integrated circuit window comparator including the high frequency attenuator 50 of the present invention. However, FIG. 2 does not show an implementation of voltage division resistors 13 and 14 in which the parasitic capacitances 25 and 26 are precisely inversely proportional to the resistances of resistors 13 and 14, respectively, as is required in accordance with the present invention.

In FIG. 2, external reference voltage $V_{REF1}$ applied to conductor 4 is divided down by resistors 8 and 9 to produce an internal reference voltage on conductor 10 which is applied by non-inverting buffer 16 to the inverting input of comparator 1. Attenuator 50, subsequently described in detail, divides the $V_{IN}$ signal applied to conductor 3 by means of resistors 13 and 14 to produce an attenuated input signal on conductor 15. The attenuated input signal on conductor 15 is applied by non-inverting buffer 17 to the non-inverting input of comparator 1. The attenuated signal on conductor 15 also is applied by non-inverting buffer 23 to the non-inverting input of comparator 2. An external reference voltage $V_{REF2}$ applied to conductor 5 is divided down by resistors 18 and 19 to produce an attenuated internal reference voltage on conductor 20, which is applied by non-inverting buffer 24 to the inverting input of comparator 2. The divider consisting of resistors 8 and 9, the divider consisting of resistors 18 and 19, and the divider consisting of resistors 13 and 14 divide $V_{REF1}$, $V_{REF2}$, and $V_{IN}$, respectively, in the same ratio.

Figure 3A:
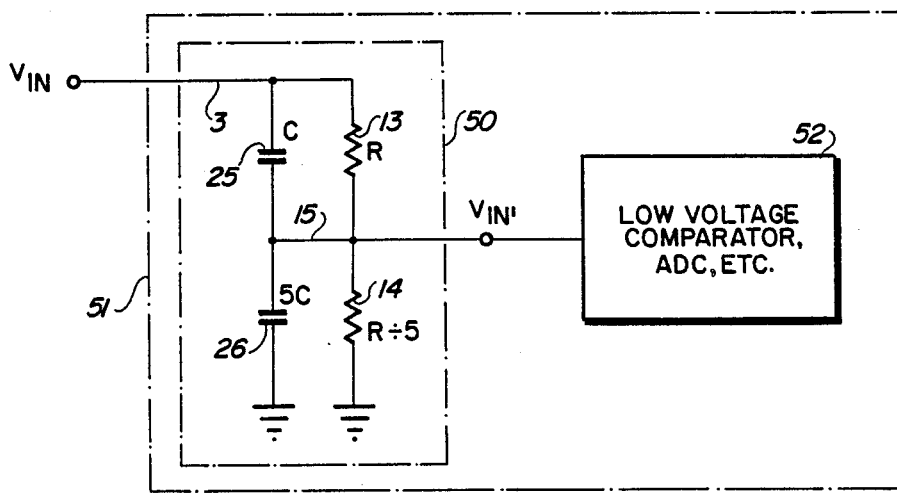
FIG. 3A is a circuit diagram useful in describing the attenuator of the present invention.

FIG. 3A illustrates an example of how parasitic capacitances 25 and 26 should correspond to the resistances of resistors 13 and 14 to provide an accurate 6-to-1 attenuation of $V_{IN}$ to produce $V_{IN}'$. If the resistance of resistor 13 is R, then the resistance of resistor 13 should be R÷5. If the parasitic capacitance of resistor 13 is C, then the parasitic capacitance of resistor 14 should be 5C.

In FIG. 3A, dotted line 51 designates an integrated circuit chip containing both high frequency attenuator 50 and another integrated circuit 52 which receives an accurately attenuated signal $V_{IN}'$ generated by attenuator circuit 50. Circuit 52 can be the window comparator circuitry in FIG. 2, a low voltage analog-to-digital converter, or the like, with an applied power supply voltage substantially less than the maximum value of $V_{IN}$. It should be appreciated that as integrated circuits are developed which provide increased performances at lower power supply voltages, the need for high frequency, high precision integrated analog attenuators will increase, because the external analog input signals applied thereto may have amplitudes so great as to cause undesired reverse biasing and/or forward biasing of certain PN junctions.

Figure 3B:
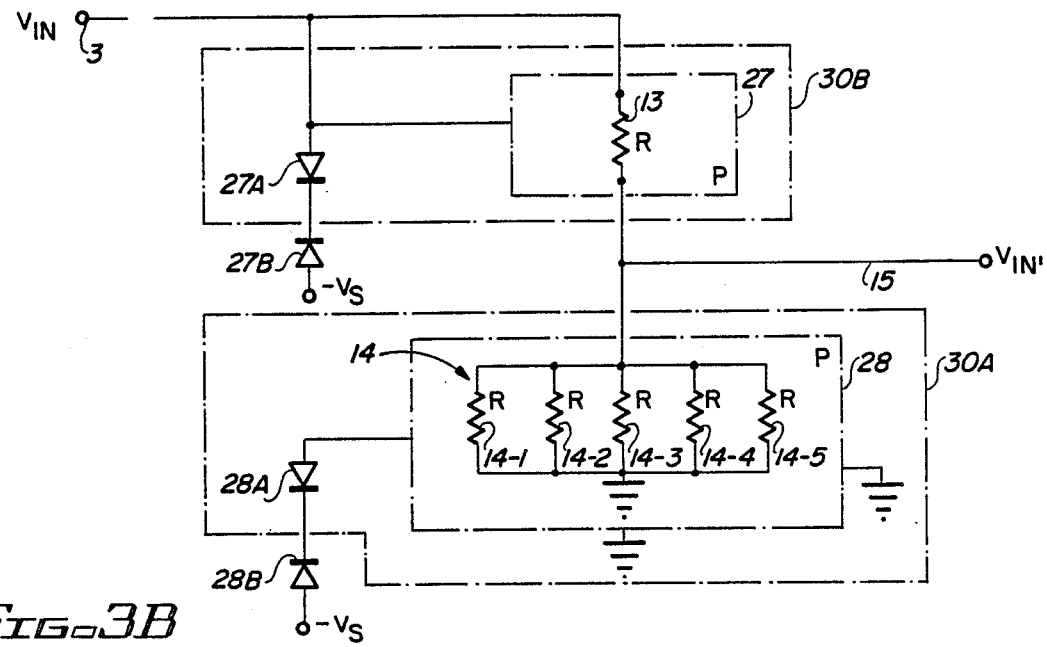
FIG. 3B is a diagram illustrating an embodiment of the attenuator of the present invention.
Figure 3C:
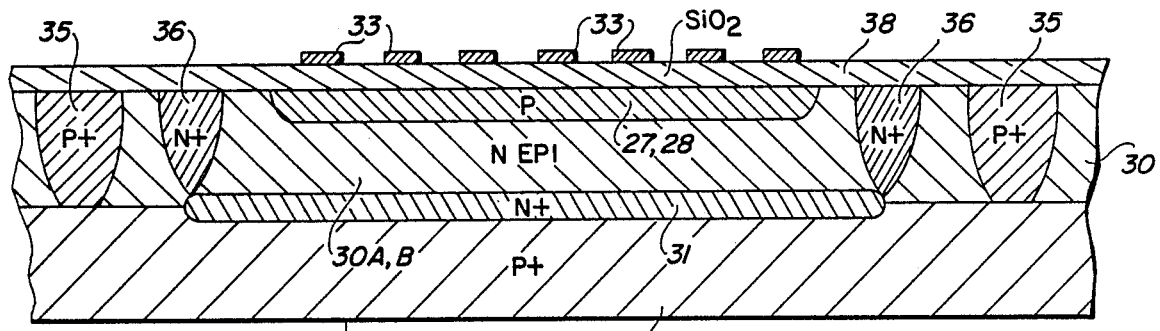
FIG. 3C is a partial section view diagram useful in describing the attenuator of the present invention.

FIG. 3B illustrates an integrated circuit implementation of the circuit shown in FIG. 3A. FIG. 3C shows a cross section of a bipolar integrated circuit implementation of the circuit of FIG. 3B or FIG. 4. The integrated circuit structure in FIG. 3C includes a P+ substrate 29. An N-type epitaxial layer 30 on the upper surface of substrate 29 includes an N-type island 30A or 30B isolated by a P+ isolation diffusion 35. A P-type diffused base region 27,28 (which can be either region 27 or 28 of FIGS. 3B and 4), is formed on the upper surface of N-type region 30A or 30B, respectively. An oxide layer 38 is disposed on the upper surface of N-type layer 30. An N+ buried layer diffused region 31 is formed beneath base type region 27 or 28. N+ collector contact regions 36 allow low resistance electrical contact to be made to N+ buried layer 31. A plurality of rectangular elongated nichrome 5 kilohm resistors 33 are disposed on oxide layer 38 over P-type region 27, 28.

Referring to FIG. 3B, resistor 13 is a nichrome resistor having a resistance R. The parasitic capacitance between resistor 13 and the underlying P-type region 27 is proportional to the area of resistor 13, and hence to its resistance. P-type region 27 is disposed in N-type region 30B, and is connected to $V_{IN}$ conductor 3. Diode 27A designates the PN junction between P-type region 27 and isolated N-type region 30B, and diode 27B designates the PN junction between N-type region 30B and P+ substrate 29.

Resistor 14 is a nichrome resistor having a resistance R/5. The parasitic capacitance between resistor 14 and the underlying P-type region 28 is proportional to the area of resistor 14. P-type region 28 is disposed in N-type epitaxial region 30A. Both N-type regions 30A and 30B are electrically floating. P-type region 28 is connected to ground. P+ substrate 29 is connected to $-V_s$. Diode 28A designates the PN junction between P-type region 28 and N-type region 30B. Diode 28B designates the PN junction between N-type region 30B and P+ substrate 29.

These back-to-back diode structures prevent clamping of $V_{IN}$ to the substrate and allow $V_{IN}$ to operate over a larger voltage range than otherwise would be permitted, and avoids undesirable reverse breakdown of certain PN junctions and/or undesirable forward biasing of certain PN junctions in the integrated circuit.

In FIG. 3B, resistor 14 is formed of five parallel resistors 14-1, 14-2...14-5 each having resistance R, and each having the same width as resistor 13. Each of the resistors 14-1, 14-2, etc. is composed of nichrome material having the same resistivity as resistor 13. Resistors 14-1, 14-2, etc., are formed over P-type region 28.

Figure 4:
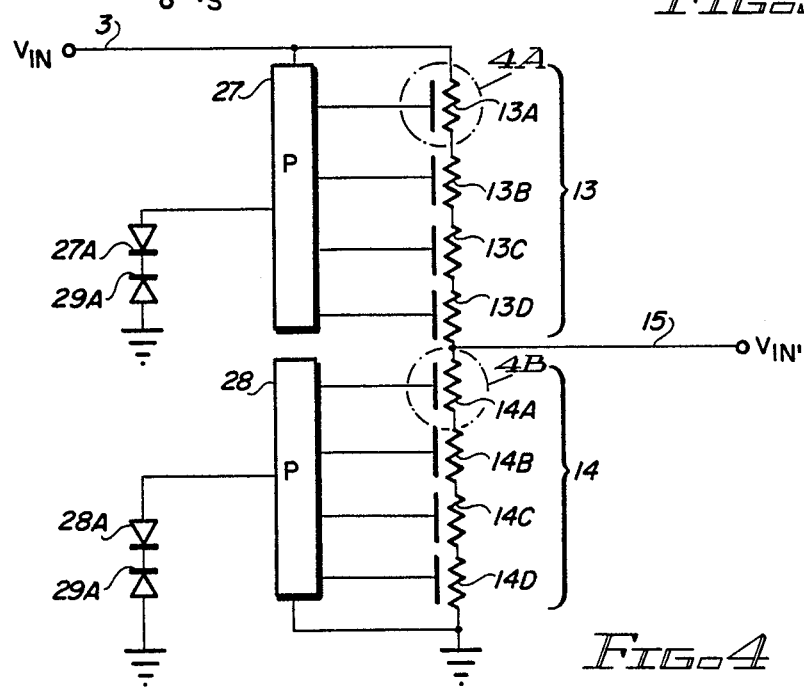
FIG. 4 is a schematic diagram useful in describing a preferred embodiment of the present invention.

FIG. 4 shows a schematic representation of a practical, accurate implementation of the attenuator circuit shown in FIG. 3B. Resistor 13 is designed to have a resistance of, for example, 100 kilohms, and is implemented by four 25 kilohm resistors 13A–13D connected in series. Each of resistors 13A–13D is formed of five 5 kilohm nichrome resistors 33 (see FIG. 3C) connected in series. Numeral 25A indicates the parasitic capacitance between each 5 kilohm nichrome resistor 33 and the underlying P-type region 27. These parasitic capacitances all therefore are, in effect, connected in parallel, even though the nichrome resistors are electrically connected in series.

Thus, voltage division resistor 13 consists of twenty 5 kilohm nichrome resistors 33 connected in series to provide the desired 100 kilohms. However, the total parasitic capacitance between resistor 13 and P-type region 27 is the sum of the 20 equal parasitic capacitances 25A between the individual 5 kilohm resistors 33 and P-type region 27.

It should be appreciated that the foregoing explanation of the capacitive voltage division is somewhat oversimplified. Actually, the parasitic capacitances associated with the individual resistor segments (33) are not in parallel, but rather, have one terminal in common, and their respective second terminals distributed along the resistor strings. Referring to FIG. 4, the result of having the capacitances connected in this fashion is that any change in $V_{IN}$ causes unequal voltage changes across parasitic capacitances 13A, 13B, 13C, and 13D. Similarly, as $V_{IN}'$ changes in accordance with changes in $V_{IN}$, the voltage changes across parasitic capacitances 14A, 14B, 14C, and 14D also will be unequal. These voltage changes will cause capacitive displacement currents that also will be unequal. It is important to note, however, that in the described embodiment the capacitive displacement current in parasitic capacitance 13D will equal that in the parasitic capacitance 14A because the voltage change across parasitic capacitance 13D is five times greater than that across parasitic capacitance 14A. But, since parasitic capacitance 14A is five times greater than parasitic capacitance 13D, the corresponding displacement currents will be equal.

Similarly, the displacement currents of parasitic capacitances 13C and 14B will be equal, the displacement currents of parasitic capacitances 13B and 14C will be equal, and the displacement currents of parasitic capacitances 13A and 14D will be equal. Thus, all of the capacitive displacement currents will sum to zero, thereby allowing accurate attenuation of the high frequency components of $V_{IN}$.

Voltage division resistor 14 is designed to have a total resistance of, for example, 20 kilohms, and includes four series-connected 5 kilohm nichrome resistors 14A–14D. The parasitic capacitance between each of the nichrome resistors 14A–14D and the underlying P-type region 28 adds in parallel with the corresponding parasitic capacitance of all of the others. Each of the 5 kilohm resistors such as 14A includes five one kilohm nichrome resistors 41 connected in series, as shown in FIG. 4B, formed over P-type region 28. Each of the one kilohm resistors 41 includes five of the 5 kilohm nichrome resistors 33 connected in parallel, as shown in FIG. 4C, formed over P-type region 28.

Thus, the total parasitic capacitance between region 28 and nichrome resistor 14 is equal to the sum of the 100 individual capacitances between each of the 100 resistors 33 and P-type region 28, even though the electrical resistance of resistor 14 is only 20 kilohms.

Thus, the resistance of resistor 13 is precisely five times that of resistor 14, producing a 6-to-1 DC voltage ratio between $V_{IN}$ and $V_{IN}'$. The parasitic capacitance of nichrome resistor 13 is precisely one-fifth that of resistor 14 producing a 6-to-1 high frequency AC voltage division ratio between V and $V_{IN}'$. Therefore, no error is produced in $V_{IN}'$ as a result of unequal attenuating of high frequency input signal and low frequency input signal components of $V_{IN}$ by nichrome resistors 13 and 14 and their respective parasitic capacitances.

The resistances of resistors 8 and 9 and the resistances of resistors 18 and 19 can correspond precisely to the resistances of resistors 13 and 14, in which case the integrated voltage comparator 100 will produce an output that indicates when $V_{IN}$ is between the voltage window defined by $V_{REF1}$ and $V_{REF2}$. The very high accuracy, high frequency and low frequency attenuation of high analog amplitude input signals needed by various low voltage integrated circuit comparators, analog-to-digital converters, and the like, is achieved.

In FIG. 5, the chip topography is shown for the integrated circuit window comparator 100 of FIG. 2, The chip measures 124 mils in the horizontal direction and 90 mils in the vertical direction. To avoid circuit operating inaccuracies due to differentials in the silicon temperature resulting from variations in power dissipation in comparators 1 and 2, in buffers 16, 17, 23, and 24, especially in comparator output transistor areas 55A and 55B and comparator output transistor areas 56A and 56B, the layout was arranged so that, to the extent possible, the topography of the right half of the chip is a mirror image of the topography of the left half of the chip, with center line 57 dividing the two halves.

The greatest thermal differentials are created by the four comparator output transistors, so they were located in the upper left and right corners of the chip, as far as possible from the precision attenuator resistors 13 and 14. As indicated above, the resistors 13 and 14 are formed over N-type epitaxial regions. In FIG. 5, the locations of the epitaxial regions are shown. To further minimize thermal effects, resistor 13 was broken up into two sections symmetrically positioned about center line 57. More specifically, N-type region 30A was broken into two equal sections 30A-1 and 30A-2, positioned as shown, and N-type region 30B was broken into two sections 30B-1 and 30B-2 symmetrically positioned about center line 57 as shown. Block 62 contains additional input circuitry that is not important to the present invention.

The $V_{IN}$ bonding pad conductor 3 and an analog ground conductor pad 60 are positioned in the middle of the lower edge of the chip to enable them to be wire bonded to the lowest inductance leads of a DIP lead frame, and the power supply common conductor bonding pads are located similarly along the upper edge of the chip for the same reason. The bias circuitry required for operation of comparators 1 and 2 is located in areas 58A and 58B positioned symmetrically about center line 57. The buffer circuitry containing the above-mentioned buffers are laid out in mirror image fashion in block 16, 17, 23, and 24, as shown. Comparators 1 and 2, including their respective output transistors, are generally located in the upper half of the chip. This layout gives maximum isolation of the nichrome resistors forming the attenuator and therefore results in minimum inaccuracy caused by thermal differences generated in the silicon during chip operation.

While the invention has been described with reference to a particular embodiment thereof, those skilled in the art will be able to make variations from the described embodiments without departing from the true spirit and scope of the invention. For example, the nichrome resistor 33 could be formed directly over N-type region 30A instead of P-type region 27,28 in FIG. 3C if the protective effect of diodes 27A and 28A in FIGS. 3B and 4 is not needed.

What is claimed is:

1. An integrated circuit high frequency attenuator, comprising in combination:
   (a) an input conductor for conducting an external input signal;
   (b) a thin film first resistor having a first terminal coupled to the input conductor;
   (c) a thin film second resistor having a first terminal connected to a reference voltage conductor and a second terminal connected to a second terminal of the first resistor;
   (d) an output conductor connected to the second terminals of the first and second resistors for conducting an attenuated input signal produced by the high frequency attenuator in response to the input signal,
   wherein the first resistor includes a plurality of separate identical segments, each having a resistance and a parasitic capacitance, connected in series between its first and second terminals, and the second resistor includes a plurality of separate identical segments, each having a resistance and a parasitic capacitance, connected in series-parallel arrangement so that a ratio of the resistance of the first resistor to the resistance of the second resistor is precisely equal to a ratio of the parasitic capacitance of the second resistor to the parasitic capacitance of the first resistor.

2. The integrated circuit high frequency attenuator of claim 1 wherein all of the identical segments of the first resistor are formed over a first isolated region of a first integrated circuit structure and wherein all of the identical segments of the second resistor are formed over a second isolated region of the integrated circuit structure.

3. The integrated circuit high frequency attenuator of claim 2 wherein the second resistor includes a plurality of series-connected groups of the identical segments, each of the groups including a plurality of the identical segments connected in parallel.

4. The integrated circuit high frequency attenuator of claim 2 wherein the first and second isolated regions are P-type regions each formed in a first and second N-type region, respectively, and wherein the first isolated region is connected to the input conductor and the second isolated region is connected to the reference voltage conductor.

5. An integrated circuit window comparator, comprising in combination:
   (a) first and second comparators;
   (b) first and second voltage divider means for dividing down external first and second reference voltages to produce internal third and fourth reference voltages, respectively;
   (c) means for applying the third reference voltage to a first input of the first comparator and means for applying the fourth reference voltage to a first input of the second comparator;
   (d) a divider circuit for dividing an external input voltage, including a thin film first resistor having a first terminal receiving the input voltage, a thin film second resistor having a first terminal connected to a reference voltage conductor and a second terminal connected to a second terminal of the first resistor, to produce an attenuated input signal, and means for applying the attenuated input signal to a second input of the first comparator and a second input of the second comparator,
   wherein the first resistor includes a plurality of separate identical segments, each having a resistance and a parasitic capacitance, connected in series between its first and second terminals, and the second resistor includes a plurality of separate identical segments, each having a resistance and a parasitic capacitance, connected in series-parallel arrangement so that a ratio of the resistance of the first resistor to the resistance of the second resistor is precisely equal to a ratio of the parasitic capacitance of the second resistor to the parasitic capacitance of the first resistor.

6. The integrated circuit window comparator of claim 5 wherein the first and second voltage divider means divide the first and second reference voltages, respectively, in the same ratio that the divider circuit divides the input voltage.

7. The integrated circuit window comparator of claim 5 wherein all of the identical segments of the first resistor are formed over a first isolated region of a first integrated circuit structure and wherein all of the identical segments of the second resistor are formed over a second isolated region of the integrated circuit structure.

8. The integrated circuit window comparator of claim 7 wherein the first and second isolated regions are P-type regions each formed in an N-type region and wherein the first isolated region is connected to receive the input signal and the second isolated region is connected to the reference voltage conductor.

9. The integrated circuit window comparator of claim 8 wherein the third reference voltage applying means includes a first buffer circuit having an input receiving the third reference voltage and an output connected to the first input of the first comparator, the fourth reference voltage applying means includes a second buffer circuit having an input receiving the fourth reference voltage and an output connected to the first input of the second comparator, and the attenuated input signal applying means includes third and fourth buffers each having an input receiving the attenuated input signal and an output connected to the second input of the first comparator and the second input of the second comparator, respectively.

10. The integrated circuit window comparator of claim 9 wherein the second resistor includes a plurality of series-connected groups of the identical segments, each of the groups including a plurality of the identical segments connected in parallel.

11. An integrated circuit comprising in combination:
   (a) a high frequency attenuator including,
   i. an input conductor for conducting an external input signal,
   ii. a thin film first resistor having a first terminal coupled to the input conductor, iii. a thin film second resistor having a first terminal connected to a reference voltage conductor and a second terminal connected to a second terminal of the first resistor, iv. an output conductor connected to the second terminals of the first and second resistors for conducting an attenuated input signal produced by the high frequency attenuator in response to the input signal, wherein the first resistor includes a plurality of separate identical segments, each having a resistance and a parasitic capacitance, connected in series between its first and second terminals, and the second resistor includes a plurality of separate identical segments, each having a resistance and a parasitic capacitance, connected in series-parallel arrangement so that a ratio of the resistance of the first resistor to the resistance of the second resistor is precisely equal to a ratio of the parasitic capacitance of the second resistor to the parasitic capacitance of the first resistor;

(b) an analog circuit having an input conductor;

(c) buffer means for receiving the attenuated input signal and producing a buffered, attenuated input signal and applying it to the input conductor of the analog circuit.

12. The integrated circuit of claim 11 wherein the analog circuit includes an analog-to-digital converter.

13. The integrated circuit of claim 11 wherein the analog circuit is connected to first and second supply voltage conductors, a power supply voltage difference between the first and second supply voltage conductors being substantially smaller than a maximum amplitude of the input signal.

14. A method of accurately reducing the amplitude of an input signal having a low frequency component, a high frequency component, and a maximum amplitude, the method comprising the steps of:

(a) applying the input signal by means of an input conductor to a first terminal of a first thin film resistor and a first semiconductor region under and isolated from the first thin film resistor, a second terminal of the first thin film resistor being connected by an output conductor to a first terminal of a second thin film resistor, the second thin film resistor having a second terminal that is connected to a first supply voltage conductor, a second semiconductor region under and isolated from the second thin film resistor being electrically connected to the first supply voltage conductor;

(b) reducing the low frequency component by a factor equal to the resistance of the second thin film resistor divided by the sum of the resistances of the first and second thin film resistors to produce a reduced low frequency component of the input signal on an output conductor, there being a first parasitic capacitance between the first thin film resistor and the first semiconductor region, and there being a second parasitic capacitance between the second thin film resistor and the second semiconductor region;

(c) simultaneously with step (b), reducing the high frequency component by the factor, and causing the factor to have a value equal to the first parasitic capacitance divided by the sum of the first and second parasitic capacitances to produce a reduced high frequency component of the input signal on the output conductor.

15. The method of claim 14 including forming the second thin film resistor as a series-parallel connection of identical smaller thin film resistors such that the ratio of the first parasitic capacitance to the sum of the first and second parasitic capacitances is precisely equal to the factor.

16. The method of claim 15 including forming the first resistor by making a series connection of a first number of identical thin film resistors, and forming the second thin film resistor of a plurality of series-connected groups of resistors, each of the groups including a plurality of identical smaller thin film resistors, the thin film resistors of which the first and second resistors are formed all being identical.

17. The method of claim 14 including causing the maximum amplitude of the input signal to substantially exceed a maximum voltage tolerance of an integrated circuit in which the first and second resistors and the first and second semiconductor regions are formed, and causing the factor to be such that a reduced value of the maximum amplitude appearing on the output conductor is less than the maximum voltage tolerance of the integrated circuit.

* * * * *